United States Patent [19]

Chiang et al.

[11] Patent Number: 5,126,282
[45] Date of Patent: Jun. 30, 1992

[54] METHODS OF REDUCING ANTI-FUSE RESISTANCE DURING PROGRAMMING

[75] Inventors: Steve S. Chiang, Saratoga; Esam Elashmawi, San Jose; Theodore M. Speers, San Leandro; LeRoy Winemberg, Fremont, all of Calif.

[73] Assignee: Actel Corporation, Sunnyvale, Calif.

[21] Appl. No.: 523,978

[22] Filed: May 16, 1990

[51] Int. Cl.$^5$ .................. H01L 21/326; H01L 21/70
[52] U.S. Cl. ........................................ 437/172; 437/52;
   437/59; 437/170; 437/193; 437/922; 148/DIG. 55
[58] Field of Search ............... 437/172, 52, 170, 193,
   437/922, 59; 148/DIG. 55; 357/23.13, 59, 23.6, 13, 6

[56] References Cited

U.S. PATENT DOCUMENTS

| | | | |
|---|---|---|---|
| 4,562,639 | 1/1986 | McElroy | 437/170 |
| 4,569,120 | 2/1986 | Stacy | 148/DIG. 55 |
| 4,651,409 | 3/1987 | Ellsworth | 437/31 |
| 4,792,835 | 12/1988 | Sacarisen | 357/23.6 |
| 4,823,181 | 4/1989 | Mohsen | 357/54 |
| 4,874,711 | 10/1989 | Hughes | 437/172 |
| 4,876,220 | 10/1989 | Mohsen | 437/922 |
| 4,881,114 | 11/1989 | Mohsen | 357/13 |
| 4,899,205 | 2/1990 | Hamdy | 357/23.6 |
| 4,941,028 | 7/1990 | Chen | 357/23.13 |
| 4,943,538 | 7/1990 | Mohsen | 437/193 |

OTHER PUBLICATIONS

Tanimoto, M., et al., IEEE Trans. Elec. Der. Ed-27, #3, Mar. 1980, pp. 517-520.

Primary Examiner—Brian E. Hearn
Assistant Examiner—Linda J. Fleck
Attorney, Agent, or Firm—Kenneth D'Alessandro

[57] ABSTRACT

An already-programmed anti-fuse is DC soaked by passing DC current through the anti-fuse from a DC voltage source applied across the electrodes of the anti-fuse. The anti-fuse resistance is lower when the DC voltage being applied such that the positive end of the voltage source is applied to the electrode having the higher arsenic concentration.

An already programmed anti-fuse is AC soaked, by passing alternating current pulses through the anti-fuse from an AC voltage source applied across the anti-fuse electrodes. This AC soak may even be applied following the controlled polarity DC soak disclosed herein. The AC soaked anti-fuse resistance is even lower than DC soaked anti-fuse under the same soak current level.

5 Claims, 6 Drawing Sheets

METHODS OF REDUCING ANTI-FUSE RESISTANCE DURING PROGRAMMING

BACKGROUND OF THE INVENTION

1. Field Of The Invention

The present invention relates to semiconductor technology. More specifically, the present invention relates to one-time user-programmable anti-fuses which present an open circuit prior to programming, and a low-resistance connection after programming. The present invention comprises improved programming methods for such anti-fuse structures.

2. The Prior Art

One-time user-programmable anti-fuses which present an open circuit prior to programming, and a low-resistance connection after programming are known in the prior art. Such anti-fuses include two conducting electrodes which are separated from one another by a single layer or multilayer dielectric material and are programmed by placing across the electrodes a programming voltage of sufficient magnitude to rupture the dielectric layer and create a conductive filament therethrough.

It is known that anti-fuse resistance can be reduced by heavy arsenic doping of one or both anti-fuse electrodes. An example of such an anti-fuse is disclosed and claimed in U.S. Pat. No. 4,823,181 to Mohsen et al.

It is also known to improve anti-fuse structures of the type disclosed and claimed in the above-identified patent by providing that the arsenic doping of at least one electrode be performed such that a high concentration of arsenic atoms exists at the interface of the heavily doped electrode and the dielectric layer, a condition sometimes referred to as arsenic pile-up. An example of such an anti-fuse is disclosed and claimed in U.S. Pat. No. 4,899,205 to Hamdy et al.

The programming of both of these anti-fuses and other arsenic doped anti-fuse structures according to prior art techniques includes the step of applying a DC voltage across the two electrodes, the voltage being of sufficient magnitude to rupture the dielectric in between the electrodes to create a low resistance filament connecting the two electrodes together. A programming procedure for such anti-fuse structures is disclosed in co-pending application Ser. No. 381,630, filed Jul. 18, 1989. That application discloses that, after the initial application of one or more pulses of programming voltage which serve to rupture the dielectric layer between the two electrodes, pulses of programming voltage are repeatedly applied while the current through the anti-fuse is monitored in order to determine the resistance of the programmed anti-fuse. This procedure after initial dielectric rupture is sometimes referred to as "soaking" the anti-fuse, and it is performed in an attempt to lower the final anti-fuse resistance. When the resistance value has reached a desired level, or when the change in resistance between successive pulses drops below a predetermined level, the programming process is terminated.

Furthermore, in that co-pending application, the "soaking" voltage pulse has the same polarity as the programming pulse. No attempt was made to optimize the polarity of the soaking pulse.

While it is apparent to those of ordinary skill in the art that it is preferable to choose the programming voltage polarity to reduce the programming time, it is not apparent that the "soaking" voltage pulse polarity may also be chosen separately from the polarity of the programming pulse in order to lower final antifuse resistance.

It will be apparent to those of ordinary skill in the art that the higher the soaking current or the programming current, the lower the anti-fuse resistance will be.

For a given anti-fuse in the hands of the programmer, the arsenic concentration in the electrodes is fixed, and when the programming and soaking current level becomes relatively constant, it has heretofore been assumed that the programmed anti-fuse resistance has been minimized.

BRIEF DESCRIPTION OF THE INVENTION

It has been discovered that the resistance of a programmed anti-fuse of the types including arsenic doping of one or both anti-fuse electrodes can still be improved by one or both of two methods disclosed herein while keeping the soaking current at a constant level.

In a first aspect of the present invention, the already-programmed anti-fuse is DC soaked by passing DC current through the anti-fuse from a DC voltage source applied across the electrodes of the anti-fuse, the DC voltage being applied such that the positive end of the voltage source is applied to the electrode having the higher arsenic concentration. The arsenic ion, which is positively charged, then will move from the electrode with the highest concentration through the antifuse filament to the electrode with the lower arsenic concentration, thus reducing the antifuse resistance.

In a second aspect of the present invention, the already programmed anti-fuse is AC soaked, by passing alternating current through the anti-fuse from an AC voltage source applied across the anti-fuse electrodes. This AC soak may even be applied following the controlled polarity DC soak disclosed herein.

DETAILED DESCRIPTION OF A PREFERRED EMBODIMENT

Figure 1A:
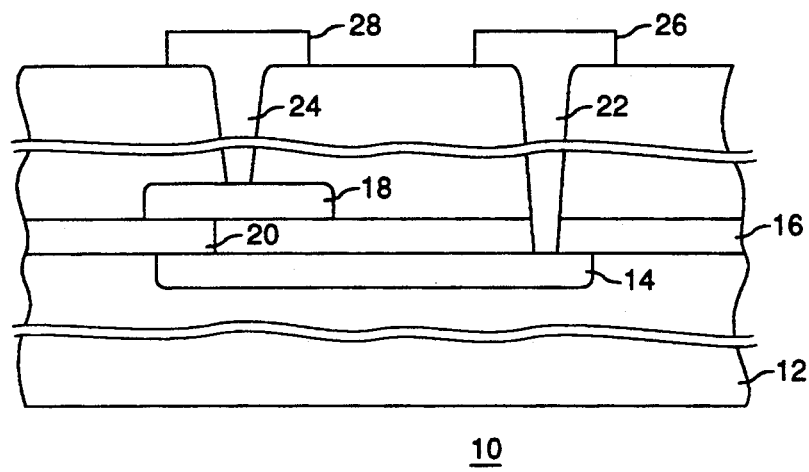
FIG. 1a is a diagram of an anti-fuse connected to apparatus useful for carrying out the method of the present invention.

A first aspect of the present invention includes a DC current soaking step performed after the anti-fuse dielectric is ruptured. Referring first to FIG. 1, an anti-fuse 10 is shown fabricated on a semiconductor substrate 12, including a lower electrode 14, a dielectric 16, and an upper electrode 18. In the example of FIG. 1, lower electrode 14 is shown as a diffused region in substrate 12 which may be arsenic doped, and upper electrode 18 may be a layer of arsenic-doped polysilicon, although those of ordinary skill in the art will recognize that the present invention is not limited in its use to such structures. This invention is not limited to an embodiment of an antifuse wherein one electrode is a diffused region in the substrate. The invention is believed to function with antifuses having a dielectric sandwiched between two polysilicon layers, a polysilicon layer and a metal layer, or two metal layers.

A conductive filament 20 has been created in dielectric layer 16 of anti-fuse 10 by the application of a programming voltage between electrodes 14 and 18 (via contacts 22 and 24 and metal lines 26 and 28) which has resulted in the rupture of the dielectric layer 16.

Figure 1B:
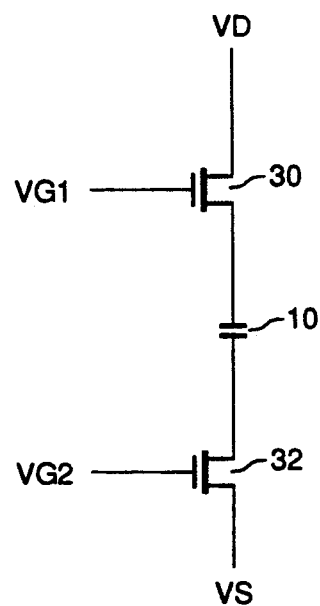
FIG. 1b is a schematic diagram of the antifuse including two internal high voltage transistors which are used during programming.
Figure 2:
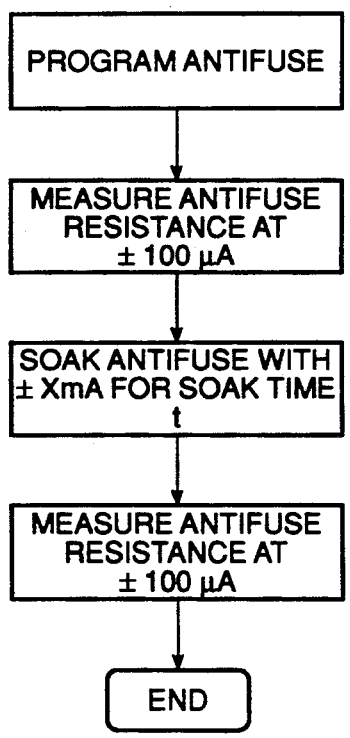
FIG. 2 is a flow chart illustrating the DC soaking procedure according to a presently preferred embodiment of the invention.

Referring now to FIG. 1b, circuitry disposed on the same substrate as antifuse 10 is used to program antifuse 10, and includes first and second high voltage N-channel MOS transistors 30 and 32. During initial programming, transistor 30 has a voltage of about 20 volts placed on its gate ($V_{G1}$) and transistor 32 has a voltage of about 2.5 volts placed on its gate ($V_{G2}$). In addition, the substrate is biased at about −1 volt in order to use $V_{G2}$ to control the programming current in a range from about 1 μA to about 5 mA. By doing this, breakdown of transistor 32 due to current surge in its drain is avoided. Control of programming current also avoids dumping excess current through antifuse 10. Those of ordinary skill in the art will recognize that the present invention is not limited in its use to such structures with two transistors only. The number of transistors can be increased. In addition, the anti-fuse can be either in series with or in parallel with the transistors. In addition, resistors may be used in series with the anti-fuse in conjunction with or instead of transistors to control the programming and soaking current as well.

After the dielectric in antifuse 10 has initially been ruptured, a DC or AC soaking period is initiated. During this period, $V_{G1}$ and $V_{G2}$ are set at about 20 volts. The substrate bias is removed, and a current or voltage source may be used to apply continuous or pulsed DC or AC current to antifuse 10.

At this point in time, according to the present invention, additional programming pulses, referred to herein as "soaking pulses" may be applied to the already-programmed anti-fuse from a DC voltage or current source having its most positive output voltage connected to the one of electrodes 14 or 18 which is the most heavily doped with arsenic. Applying the positive potential to the more heavily arsenic-doped electrode will result in lower antifuse resistance. In the embodiment illustrated in FIG. 1, it is assumed that the polysilicon layer comprising upper electrode 18 is more heavily doped with arsenic, so the most positive terminal of the DC voltage or current source is connected to metal line 28, and hence to upper electrode 18, and the other terminal of the DC voltage or current source is connected to metal line 26, and hence to lower electrode 14.

Figure 3:
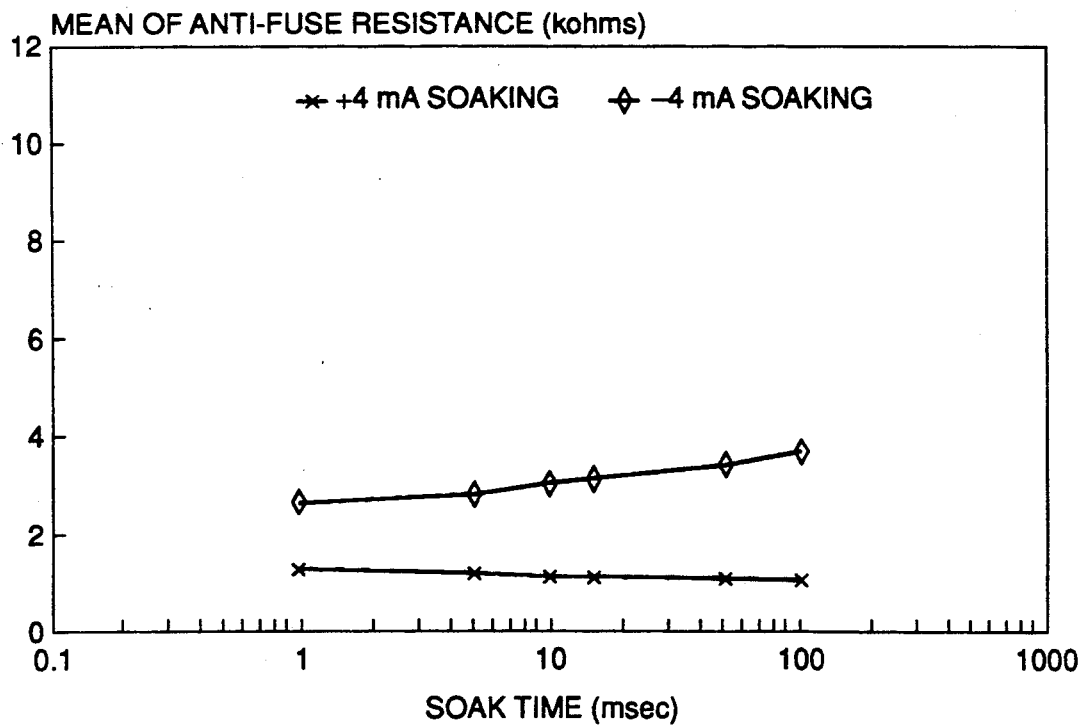
FIG. 3 is a graph showing the effect of DC soaking pulse polarity on anti-fuse resistance.

The effect of DC soaking polarity on anti-fuse resistance is shown in FIG. 3, wherein 4mA DC soak current is applied through electrodes with different arsenic concentrations (heavier concentration in poly silicon). The resistance is later read by applying +100uA through poly electrode. For +4mA soaking (i.e. +4mA current is applied through poly silicon), the anti-fuse resistance is low. For −4mA soaking, the anti-fuse resistance is high. This graph demonstrates that DC soaking polarity is important. The above results demonstrate that, for the same magnitude of soaking current, a lower antifuse resistance can be obtained if the positive soaking polarity is applied to the antifuse electrode having the highest arsenic concentration.

Figure 4:
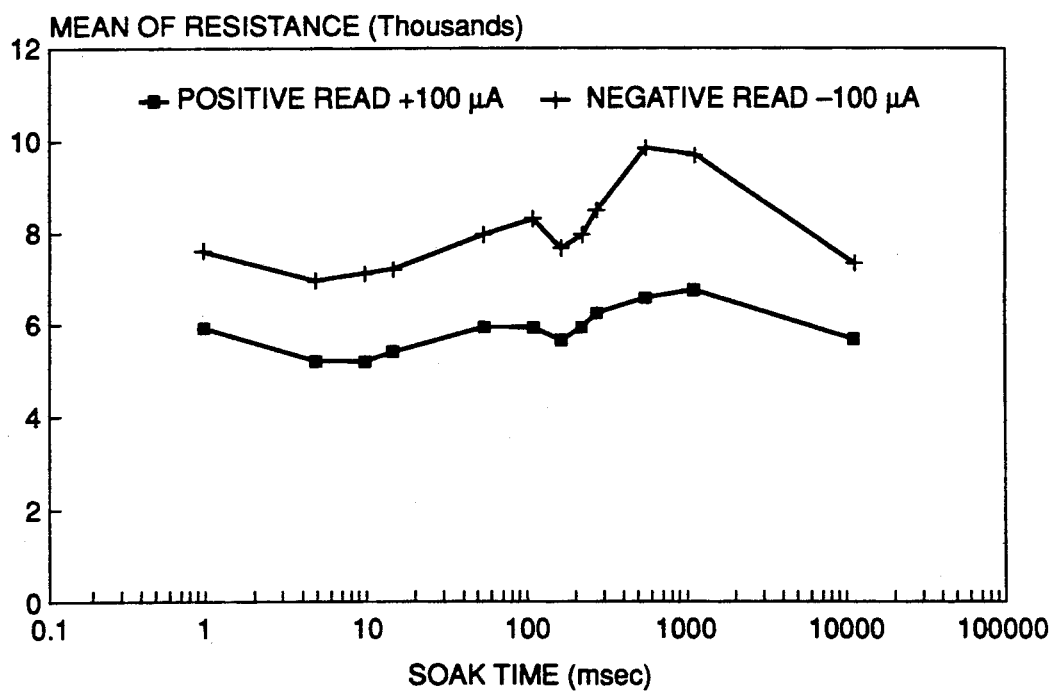
FIG. 4 is a graph showing the difference in mean value of antifuse resistance between positive and negative soaking polarity.

Another point about DC soaking is that the anti-fuse resistance after soaking may not be symmetrical if the read current is of different polarities symmetrical. It is shown in FIG. 4 that when the anti-fuse is soaked by +2mA (i.e. positive voltage is applied through poly which has a higher arsenic concentration), the mean value of anti-fuse resistance read at +100uA is lower than the mean value of anti-fuse resistance read at −100uA. This difference is further magnified in the standard deviation of anti-fuse resistance as described in FIG. 5. In both cases, positive read (+100uA) shows lower resistance than negative read. It should be pointed out that it is important in the circuit application to keep anti-fuse resistance symmetrical reading from either direction. Therefore, it is necessary to choose an optimum DC soaking condition to reduce the asymmetric nature of the anti-fuse resistance. For example, this can be achieved by increasing the programming current as shown by a comparison of FIGS. 3 and 4.

In a presently preferred embodiment, where the arsenic concentration is between about $1 \times 10^{18}$ to $1 \times 10^{21}$ atoms/cm$^3$, i.e., antifuses of the type described in U.S. Pat. No. 4,889,205, about 1 to 10,000 DC soaking pulses having pulse widths 1μs to 10 sec have been found to be effective for DC soaking where the current range is between 1 μA & 5 mA. Use of longer pulse widths may result in increased chances of accidentally programming unwanted antifuses in an array. Use of fewer DC soaking pulses has been found to result in higher than optimum final antifuse resistance, and a greater number of DC soaking pulses does not appear to further lower antifuse resistance to any significant degree and may even in fact be worse once it passes the optimum time. Furthermore, longer soaking time negatively affects programming throughput as well. While the above condition has been found to be most useful for the antifuse used in the product designated 1010 by Actel Corporation, the assignee of the present invention, it should be noted that the optimum number of pulses and the pulse width depend on many factors. For example, pulse width and number of pulses are inversely proportional to arsenic concentration and soaking current level.

Figure 6:
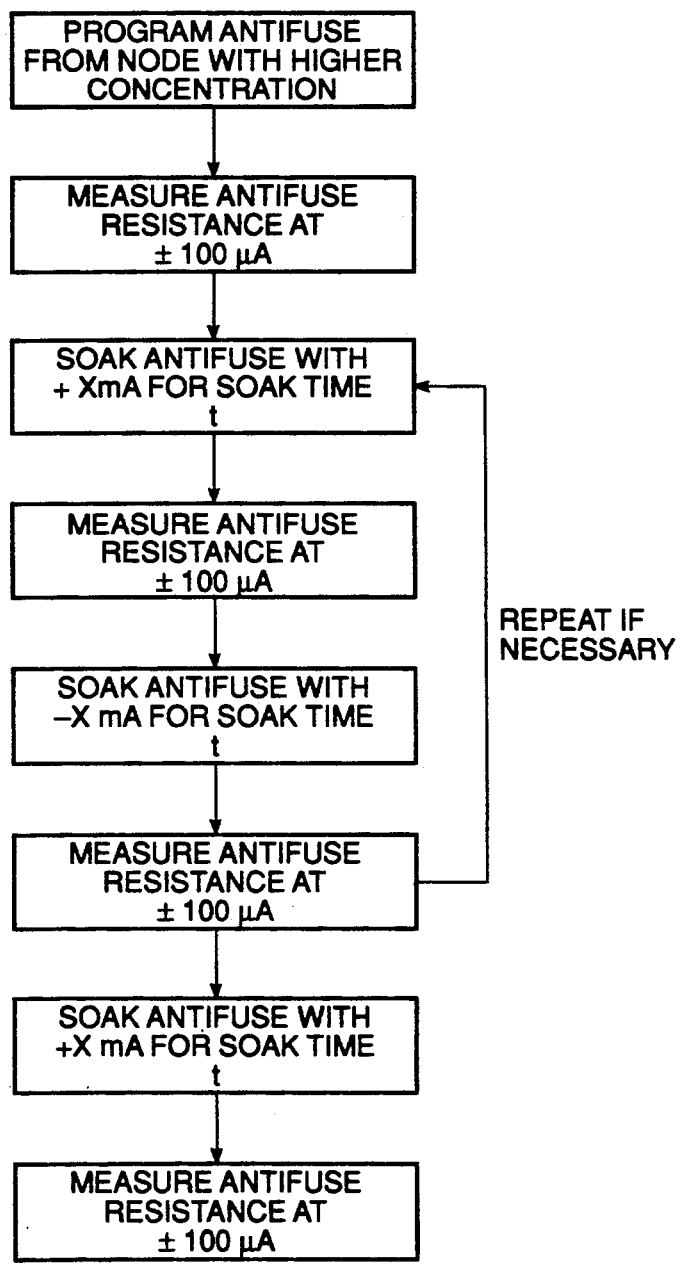
FIG. 6 is a flow chart illustrating the AC soaking procedure according to a presently preferred embodiment of the invention.
Figure 7:
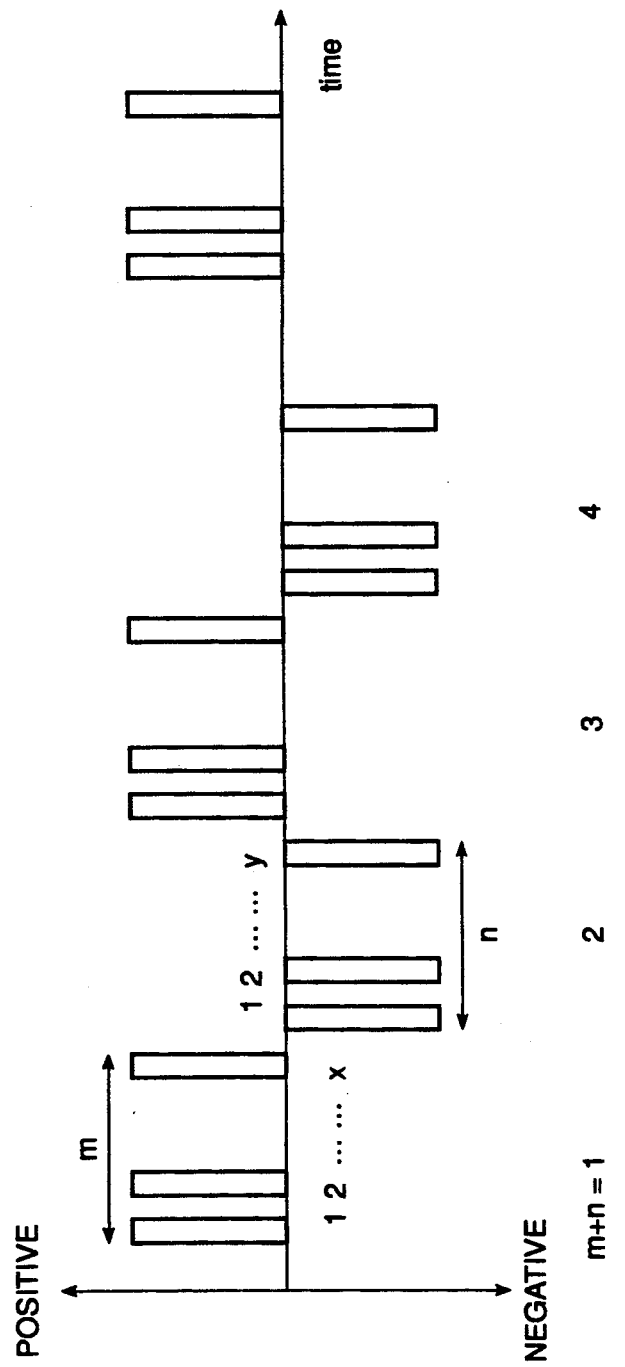
FIG. 7 shows the definition of AC pulse condition.

A second aspect of the present invention includes soaking the already programmed anti-fuse with AC soaking pulses. The process for applying soaking pulses having different polarities to a single antifuse is shown in the flow diagram of FIG. 6. A typical AC pulse configuration is shown in FIG. 7. One cycle of AC pulse may consist of x DC pulses in one direction for m times and y DC pulses in another direction for n times, where x,y,m,n are all positive integers equal to or greater than one. the number of alternating pulses (i.e., m+n ) is important. The quantity (m+n) has to be at least greater than or equal to 3 for AC soaking to be effective in lowering antifuse resistance. This point is demonstrated in FIG. 8 where a 2 mA AC pulse with pulse width 1 mS is applied through anti-fuse described in FIG. 1. In this case x and y are both equal to one. The anti-fuse resistance is higher with m=1 and n=1 (m+n=2) than the anti-fuse resistance with m=1 and n=0(m+n=1 only. This means the with only one pair of AC soaking pulse the anti-fuse resistance will increase instead of decrease. With at least more than one pair of pulses, e.g. m=2 and n=1 (m+n=3), the anti-fuse resistance starts to reduce again and it reaches a stable value with larger m+n. One advantage of present AC soak over DC soak as described in the first aspect of the invention is that it reaches a stable and lower anti-fuse resistance value with much shorter time under the same current level. Comparison between FIG. 4 and FIG. 8 indicates this point very clearly.

Figure 5:
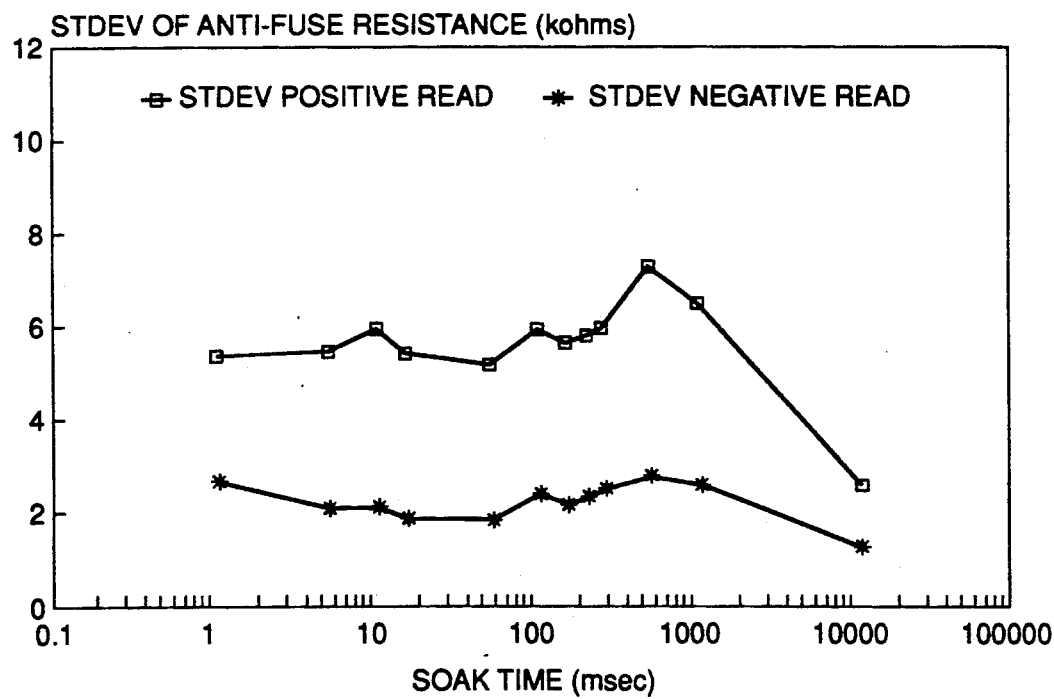
FIG. 5 is a graph showing the difference in standard deviation of DC soaked anti-fuse resistance described in FIG. 4.
Figure 8:
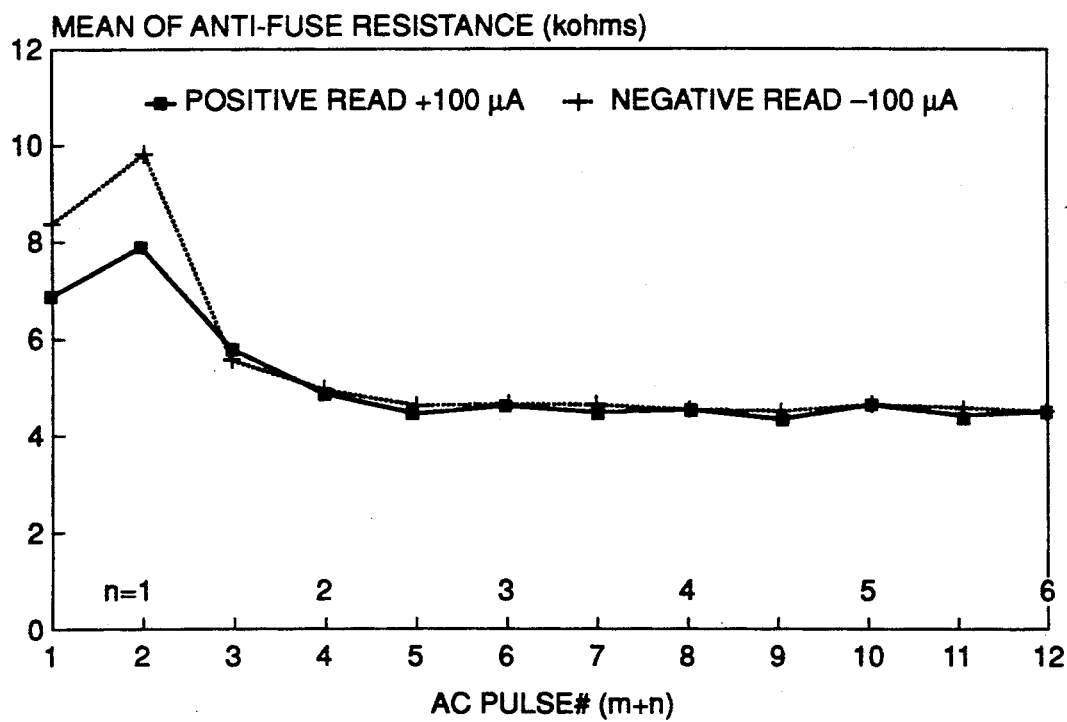
FIG. 8 is a graph showing the difference in mean of the antifuse resistance AC soaked at 2mA but read at $+100\ \mu A$ and $-100\ \mu A$.
Figure 9:
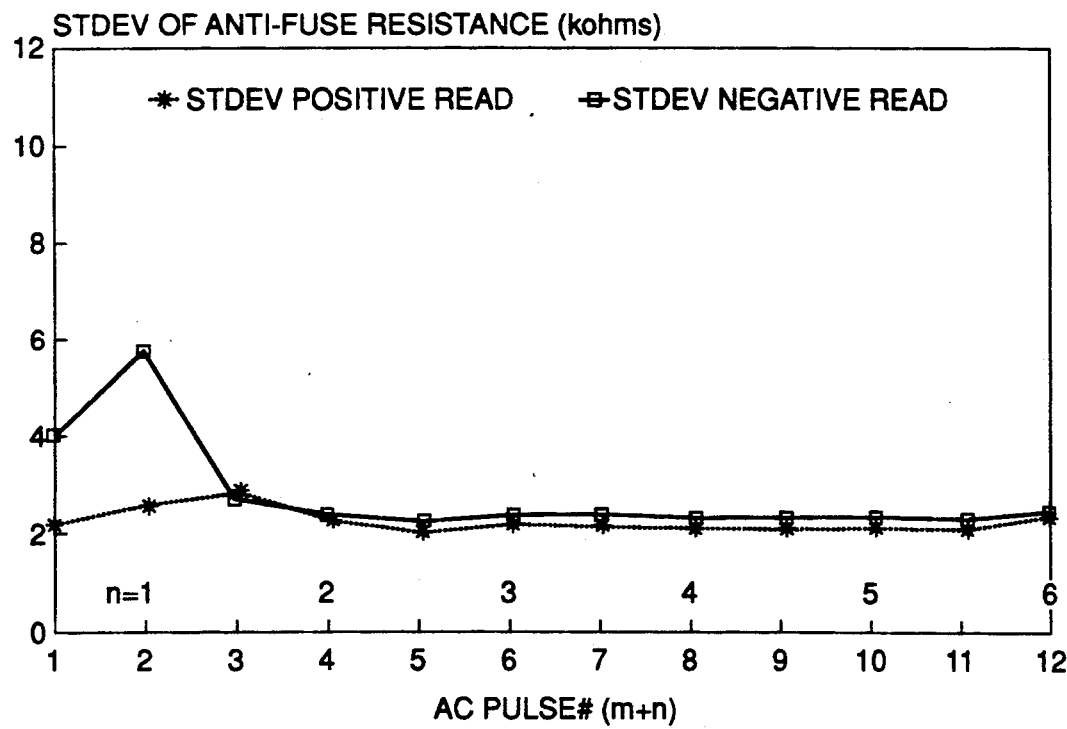
FIG. 9 is a graph showing the difference in standard deviation of the antifuse resistance described in FIG. 8 as a result of AC soaking according to the present invention.

Another advantage of AC soaking is that it reduces the resistance difference with positive and negative read current. In DC soak, the mean read resistance can be asymmetrical between positive and negative read current as shown in FIG. 4. This difference is especially noticeable in the standard deviation of the anti-fuse resistance as seen in FIG. 5. As shown by FIGS. 8 and 9, this difference for both mean and standard deviation is greatly reduced with AC soak.

The AC soaking method is found to be effective especially for low soak current condition between 1 uA to 5 mA. The lower the soaking current, the more effective the AC soak method over the DC soak. When the soak current is about 5 mA, AC soak and DC soak resistance reaches low value for both positive and negative read polarities. This indicates that the antifuse resistance is already symmetric for both AC and DC soak. Therefore, the need for AC soak at high current level may not be necessary.

To maximize the AC soaking effect, the AC soaking pulse width used is preferably short (between 1 μsec and 1 sec). Subjecting the antifuse to a greater number of cycles of AC soaking is presently preferred over longer soaking time with fewer cycles. For example it was found that for m+n=10, x=y=1 ms is just effective as x=y=1 sec. Therefore, to maximize the AC soaking effect, it is preferable a greater number of shorter pulses instead of fewer longer pulses.

The choice of start and finish soak pulse polarity is also important. The positive pulse should be applied first and last to the node which has a higher arsenic concentration. An example is shown in FIG. 8.

In FIG. 8, m refers to +2 mA being applied to poly electrode which has a higher arsenic concentration and n refers to −2 mA being applied to poly electrode. When m=n, the anti-fuse resistance is lower when it stops on m instead of stops on n for m+n=5. Therefore, it is preferred that the soak pulse starts on high arsenic concentration node and ends on the same node too. In addition, this concept can be further extended by choosing a larger x number (longer soaking time with positive voltage on higher arsenic concentration node) and smaller y number (shorter soaking time with positive on lower arsenic concentration node). In this case, the DC soaking concept is incorporated in the AC soaking.

In a typical example of the practice of the present invention, an optimized already-programmed Actel 1010 antifuse is AC soaked but with DC soaking condition taken into consideration. Due to asymmetric arsenic doping in the electrodes, DC soaking is first utilized with the positive voltage applied to the electrode having the highest arsenic concentration. The AC soaking procedure utilized, commences with a positive soaking pulse (with respect to the more heavily doped electrode) for 75 msec, followed by a negative soaking pulse for 5 msec, followed by a second positive soaking pulse for 75 msec, followed by a second negative soaking pulse for 5 msec, followed by a third positive soaking pulse for 75 msec. This condition was found to be effective for soaking currents between 2–3 ma.

While a presently-preferred embodiment of the invention has been disclosed, those of ordinary skill in the art will, from an examination of the within disclosure and drawings, be able to configure other embodiments of the invention. These other embodiments are intended to fall within the scope of the present invention which is to be limited only by the scope of the appended claims.

What is claimed is:

1. A method for minimizing the on-resistance of a programmed anti-fuse of the type comprising two electrodes separated by a dielectric layer, at least one of said electrodes doped with arsenic, including the step of applying a plurality of alternately positive (m) and negative voltage pulses (n) from a pulsed voltage source to the electrodes of said anti-fuse, the first and last pulses having a polarity such that the most positive potential of said first and last pulses is applied to the one of said electrodes having the highest concentration of arsenic.

2. The method of claim 1 wherein m+n is equal to or greater than 3.

3. The method of claim 1 wherein the pulse width of the positive pulses is between about 150 μsec and 1 sec and the pulse width of the negative pulses is between about 150 μsec and 1 sec.

4. The method of claim 3 wherein each positive pulse includes from between 1 to about 2,000 individual pulses and each negative pulse includes from between 1 to about 1,000 individual pulses.

5. The method of claim 1 where the voltage is chosen to produce a soaking current in the range of from about 1 μA to 5 mA.

* * * * *